United States Patent [19]

Barlow et al.

[11] 4,225,408

[45] Sep. 30, 1980

[54] PROCESS FOR ELECTROLYTICALLY PREPARING A SEMICONDUCTING FILM ON A FLEXIBLE SUBSTRATE

[75] Inventors: William A. Barlow; Maurice Rhodes; Francis R. Sherliker; Edward W. Williams, all of Runcorn, England

[73] Assignee: Imperial Chemical Industries Limited, London, England

[21] Appl. No.: 31,874

[22] Filed: Apr. 18, 1979

Related U.S. Application Data

[63] Continuation of Ser. No. 795,303, May 9, 1977, abandoned.

[30] Foreign Application Priority Data

May 17, 1976 [GB] United Kingdom ............... 20199/76

[51] Int. Cl.² ..................... C25D 13/04; C25D 13/16; H01L 31/00; H01L 7/00

[52] U.S. Cl. ............................. 204/181 N; 136/260; 136/264; 136/265; 148/15

[58] Field of Search ............ 204/181 N, 181 F, 192 S; 148/187, 1.5

[56] References Cited

U.S. PATENT DOCUMENTS

| 3,879,276 | 4/1975 | Underwood et al. | ........... 204/181 N |
| 4,011,149 | 3/1977 | Nozilc | ............................. 136/89 NB |

FOREIGN PATENT DOCUMENTS

221527  5/1957  Australia ............................. 204/181 N

*Primary Examiner*—Howard S. Williams
*Attorney, Agent, or Firm*—Cushman, Darby & Cushman

[57] ABSTRACT

Electrophoresis of a colloidal suspension of a semiconducting sulphide, sulphoselenide, selenide or telluride in an aqueous medium produces a thin pin-hole-free film on a surface of a substrate. The film may be employed in solar cells.

32 Claims, 2 Drawing Figures

PROCESS FOR ELECTROLYTICALLY PREPARING A SEMICONDUCTING FILM ON A FLEXIBLE SUBSTRATE

This is a continuation of application Ser. No. 795,303 filed May 9, 1977, now abandoned.

This invention relates to a method for the preparation of inorganic films and to products comprising such films.

The method of the invention finds particular application in the preparation of semiconductor thin films (i.e. films of thickness of the order of 50 mm to 50,000 nm) and especially in the preparation of films which are substantially free from "pin-holes". The invention relates particularly to the preparation of films comprising a semiconducting sulphide, sulphoselenide, selenide or telluride.

The most widely used process for the preparation of thin pin-hole-free films of a semiconductor is vacuum evaporation, which process is limited to the coating of small areas.

The present invention provides a method for the preparation of a thin substantially pin-hole-free film which comprises the electrophoresis of a colloidal suspension of a semiconducting sulphide, sulphoselenide, selenide or telluride or precursor thereof in an aqueous medium and deposition of the semiconductor or precursor thereof on a surface of a substrate.

The invention also provides a thin substantially pin-hole-free film, particularly a film having an area greater than 500 sq cm, between 50 nm and 50,000 nm thick, preferably between 500 nm and 5000 nm thick, prepared by electrophoretic deposition from a colloidal suspension of a semiconducting sulphide, sulphoselenide, selenide or telluride or precursor thereof in an aqueous medium.

Within the term "film" we include coatings and sandwiched layers having a thickness between 50 nm and 50,000 nm.

By the phrase "semiconducting sulphide, sulphoselenide, selenide, telluride" we mean a sulphide, sulphoselenide, selenide or telluride of cadmium, zinc mercury, copper (I), lead or other suitable metals well known in the semiconductor art to form semiconducting sulphides, sulphoselenides, selenides or tellurides, and mixtures and alloys of these semiconductors.

By "colloidal particles" we mean particles having an average diameter between 1 and 100 nm, and by "colloidal suspension" we mean a suspension of the colloidal particles in an aqueous medium, flocculation and hence precipitation of the particles being resisted by a sheath of charges or of surfactant on the surface of the particles. Preferably the particles have an average diameter between 5 nm and 35 nm.

By "aqueous medium" we mean a mixture, preferably a single phase mixture, of water and at least one water-miscible polar organic liquid, preferably having a dielectric constant greater than 10, and more preferably greater than 20. Organic liquids which may be employed include lower alcohols having 1 to 5 carbon atoms, diols, amides, acylnitriles, ketones, esters, ethers, amines and other organic liquids well known in the electrochemical art. Preferably the aqueous medium comprises between 5% and 50% by volume of water and between 95% and 50% by volume of organic liquid. Particularly preferably the aqueous medium comprises between 10% and 30% by volume of water and between 90% and 70% by volume of organic liquid. More particularly preferably the organic liquid is a lower alcohol having 1 to 5 carbon atoms.

Colloidal particles of the semiconductor or precursor thereof may be prepared, isolated, and then suspended in the aqueous medium or suspended in water and an organic liquid added or suspended in an organic liquid and water added. Methods by which the colloidal particles may be prepared include precipitation of the semiconductor or precursor thereof from a solution, e.g. by addition of a non-solvent, and evaporation of the semiconductor or precursor thereof into a low pressure inert atomosphere or into a liquid.

Preferably however the colloidal suspension is prepared with no isolation of the colloidal particles. It is particularly preferred that the colloidal particles are prepared in water and that an appropriate amount of an organic liquid is then added to the water prior to electrophoresis to generate the aqueous medium. It is more particularly preferred that the semiconductor or precursor thereof is prepared in the water.

Where the semiconductor or precursor thereof is formed in the water by a metathetical reaction, the concentration, particle size, density and viscosity of the colloidal suspension may be controlled by control of the reaction parameters e.g. rate of addition, rate of stirring, temperature etc. Preferably one of the starting materials for the matathetical reaction is gaseous since this affords easy control of the reaction and the ready removal of an excess of one starting material; particularly preferably one of the starting materials is hydrogen sulphide.

The "concentration" of the colloidal suspension can vary within wide limits, consistent with deposition of a film of required thickness and quality in a suitable time under the conditions employed. The "concentration" of the colloidal suspension preferably is less than 50 mMolar and particularly preferably is between 1 and 25 mMolar.

The stability of the colloidal suspension may be improved by addition of a stabiliser as is well known in the colloidal art, e.g. a low molecular weight ionic species or a surfactant. Suitable surfactants for use in the process of the invention may be anionic, cationic or non-ionic.

The relative amounts of stabiliser, where employed, and colloidal particles should be such that the stabiliser is present in an amount great enough to stabilise the colloidal suspension. The relative amounts which it is necessary to use will depend, inter alia, on the average size of the colloidal particles and on the chemical nature of the stabliser. Thus, in general, the greater the surface area of the particles, the greater will be the amount of stabiliser which it will be necessary to employ. Where a stabiliser is employed it should not be disadvantageous to the process or product of the invention.

A stabiliser will not be required in every case. Simple experiment will reveal with which systems it is desirable to use a stabilizer and, where it is used, the nature and concentration of stabiliser required.

The substrate may be positioned e.g. suspended, between two electrodes of opposite polarity from each other and it may be in contact with one of them. Where a substrate is positioned between two electrodes it will be appreciated that it must be sufficiently porous to allow conduction to occur and that the surface of the substrate on which the film is to be deposited must be sufficiently conductive to avoid build up of a space charge sufficient to halt the deposition before a pinhole-free film has been deposited. The substrate may be connected to earth to avoid build up of space charge. Preferably the substrate is incorporated into an electrical circuit as an electrode, hereinafter referred to as the "working electrode", which may be either the anode or the cathode. The electrode of opposite charge to the working electrode will hereinafter be referred to as the "counter electrode". The polarity of the working electrode will be chosen in the light of the charge on the colloidal particles. Generally the colloidal particles employed in the process of the present invention are negatively charged and hence the working electrode is an anode. However by addition of an appropriate additive, e.g. cetyl trimethylammonium bromide the charge on the colloidal particles may be changed such that they migrate to the cathode and the cathode is then the working electrode.

The working electrode may be self-supporting or it may be supported on a carrier. The carrier, where it is employed, may be flexible, e.g. a thermoplastic film, or rigid, e.g. a sheet of glass. Typical thermoplastics which may be employed as a carrier include polyethylene terephthalate, polyethersulphone, and polyimide. Where a flexible carrier is employed, it may be such that the carrier, the substrate, and the film may be deformed, e.g. rolled up, with little or no deleterious effect on the film.

Materials from which the working electrode may be made include metals e.g. stainless steel, gold, platinum; metal oxides e.g. tin oxide, tin-indium oxide; and elemental, compound, or alloy semiconductors e.g. silicon, cadmium telluride. Typical supported working electrodes include a metal coating on a thermoplastic film or a tin oxide coating on a glass sheet.

Materials from which the counter electrode may be made include inter alia, stainless steel, platinum, gold and tin oxide on glass.

The working electrode is typically planar and, by employing a counter electrode of the same shape and size as the working electrode and disposed parallel to the surface, uniform field distribution may be obtained. Where the counter electrode has a different shape to that of the planar working electrode, e.g. it may be a mesh, a wire, a corrugated sheet or a tube, non-uniform field distribution is obtained. Use of a planar working electrode and a counter electrode in the form of a linear wire often gives uniform film thickness.

The surface to be coated may have an area between a few sq mm and many sq meters and the process is particularly convenient for coating areas greater than 500 sq cm. The process may be employed as a continuous process, e.g. where a strip of metal or metallised plastic which is connected to an electrical circuit is progressively transported through an electrophoretic bath.

The film may be transferred from the surface on which it was deposited to a second surface e.g. by transfer coating, which transfer process is facilitated if the first surface is treated with an appropriate release agent prior to deposition of the film. Preferably the film is maintained in permanent contact with the surface on which it was deposited such that the film and the substrate form a laminate.

Preferably the surface of the substrate is cleaned prior to deposition of the film, e.g. by treatment with degreasing agent; or ultrasonically; or etched e.g. with an ion beam or an etching fluid; or by electropolishing, to obtain good adhesion between the film and the surface.

Electrophoresis is preferably effected at pH between 3.0 and 8.0, particularly preferably at a pH between 4.0 and 5.0. Where such conditions are employed adhesion of the film to the surface may be improved and an ohmic contact may be generated at the interface between the surface and the film, e.g. deposition of cadmium sulphide from a colloidal suspension having a pH between 4.0 and 5.0 on the surface of a stainless steel electrode generally produces an ohmic contact.

Adhesion of the film to the surface may be improved by incorporating a gas suppressor in the colloidal suspension to suppress evolution of gas at the working electrode. Where the working electrode is an anode the gas suppressor is typically L-ascorbic acid or hydroquinone. Where the working electrode is a cathode, the gas suppressor is typically sodium chromate, potassium persulphate or ammonium persulphate. Where a gas suppressor is employed it should not be disadvantageous to the process or product of the invention.

Adhesion of the film to the surface of the substrate may be improved by incorporating a binding agent in the colloidal suspension, such binding agents which are well known in the electrophoretic art include inter alia, polyvinyl alcohol, polyvinyl pyrrolidone or guar gum. Where a binding agent is employed, it may subsequently be removed from the film. Where a binding agent is employed it should not be disadvantageous to the process or product of the invention.

The distance between the electrodes may be chosen to obtain an optimum voltage gradient. Typically they are between 0.1 cm and 20 cm apart with an applied voltage of 0.1 v to 1,000 v, preferably between 5 v and 350 v.

Typically the current density employed may be in the range 0.1 to 500 mA/cm$^2$, preferably it is between 0.5 and 10 mA/cm$^2$, although we do not exclude the possibility that pulsed currents having a current density above this range may be employed. The current density employed will depend inter alia, on the distance between the electrodes and on the voltage applied, simple experiment will readily reveal a suitable current density for any particular application.

The film may be between 50 nm and 50000 nm thick. Preferably the film is between 500 nm and 5000 nm thick since such films have an acceptable balance of mechanical and electrical properties, and good adhesion to the surface. Such films can usually be deposited in a relatively short time, which time depends on the operating parameters employed and typically is in the range 30 seconds to 30 minutes.

After deposition, it will often be desirable to heat the film to improve its mechanical, structural, electrical and photoelectrical properties and its adhesion to the surface of the substrate. Typically the film is heated to between 100° C. and 800° C., although temperatures outside this range are not excluded. The temperature to which the film may be heated is often limited by the temperature which the substrate will withstand. Preferably the film is heated by gaseous ion bombardment which often heats the film with little or no damage of the substrate occurring. This heat treatment may alter the composition and electrical properties of the semiconducting sulphides, sulphoselenides, selenides or tellurides employed in the present invention and a further treatment may be necessary to obtain the desired electrical properties. Such treatments are well known in the semiconductor art and include for example heating the film in the presence of e.g. sulphur, hydrogen or cadmium.

The film may contain a suitable dopant in order to modify its electrical and/or photoelectrical properties. Typically these dopants are elements from Groups Ib (e.g. copper, silver) IIIb (e.g. aluminium, gallium, indium), Vb (e.g. phosphorus), VIb (e.g. oxygen) or VIIb (e.g. chlorine, bromine, iodine) of the Periodic Table. The dopants may be included in the colloidal suspension so that they are deposited with the film or the deposited film may be subjected to an appropriate treatment well known in the semiconductor art, e.g. the dopant may be diffused into the film.

Films according to the invention may be employed for example in a variety of devices. They may be employed in solid state devices such as solar cells, phosphor coatings, photosensitive coatings, acoustic surface wave devices, electroluminescent devices, thin film transistors, infra-red reflectors and in integrated circuits. They may also be employed as electrodes in photochromic devices or fuel cells or as protective coatings in batteries.

Accordingly a further embodiment of the invention provides an electronic device comprising a thin substantially pin-hole-free film prepared by electrophoretic deposition of a colloidal suspension of a semiconducting sulphide, sulphoselenide, selenide or telluride or precursor thereof in an aqueous medium and at least one means for conducting current in electrical contact with the said film.

Films according the invention may be conveniently employed in solar cells.

By "solar cells" we mean a photovoltaic device which is capable of converting electromagnetic radiation, typically sunlight, directly into direct current electricity as a result of absorption of the radiation by a semiconductor. The absorbed radiation generates pairs of positive and negative electronic charge carriers in excess of the thermal equilibrium concentrations of such carriers. The excess electronic charge carriers of opposite sign are separated at an electrical potential barrier and then migrate to means to conduct the current from the cell, e.g. electrical contacts, on either side of the barrier. The barrier may be either a metal-semiconductor junction or a p-n junction.

The contacts are generally chosen to allow a maximum amount of radiation to penetrate to the vicinity of the junction. Often an anti-reflection coating is applied to the surface of the radiation-absorbing semiconductor on which the radiation is incident to reduce the amount of incident radiation lost by reflection therefrom.

Generally the cell is encapsulated to prevent ingress of water or oxygen into the cell which tend to reduce the life-time of the cell. It will be appreciated that encapsulation, where is is employed, will allow at least a proportion of any radiation incident on the cell to penetrate the cell.

Accordingly, a further embodiment of the invention provides a process for the preparation of a solar cell comprising, 1. preparing a thin substantially pin-hole-free first film of a semiconductor sulphide, sulphoselenide, selenide or telluride by electrophoresis of a colloidal suspension of the semiconductor or precursor thereof in an aqueous medium, 2. forming a junction between the first film and a second film comprising a metal or a semiconductor having majority charge carriers of opposite electronic charge to the majority charge carriers in the first film, and preferably heating the junction to improve the electrical contact between the films, the first film being in electrical contact with a first current conducting means where the second film is a semiconductor, the second film being in electrical contact with a second current conducting means, at least one of the current conducting means allowing radiation incident thereon to penetrate to the junction.

Preferably the first film is electrophoretically deposited on the first current conducting means. Conveniently the first and second current conducting means are electrical contacts.

Preferably an anti-reflection coating is applied to the surface of the film which is to be subjected to incident radiation and more preferably means are provided to reduce or prevent the ingress of water and/or oxygen into the cell.

Prior to formation of the junction, the first film is preferably heated to improve its mechanical, structural, electrical and photoelectrical properties. Preferably the film is heated by gaseous ion bombardment which also tends to clean the surface of the film, and it is particularly preferable to employ gaseous ion bombardment where the film is deposited on a current conducting means which comprises a thermoplastic.

A junction is formed by engaging a second film of a suitable material, i.e. a metal or semiconductor having majority charge carriers of opposite electronic charge to the majority charge carriers in the first film, with the first film.

The second film may be generated on the first film by any convenient technique, for example, evaporation, electrophoretic deposition, ion dipping, electroless deposition, electroplating or solid state reaction. Alternatively, a preferred second film may be engaged with the first film, e.g. by transfer coating.

Where the second film is a semiconductor, the cell is provided with a second electrical contact which makes electrical contact with the second film. The second electrical contact is typically a gold or copper mesh. The second electrical contact may for example, be evaporated onto the second film, or deposited electrophoretically thereon, or screen printed thereon, or applied as a preformed mesh, e.g a gold plated copper mesh or a silver mesh. Alternatively the second film may be formed on a second substrate, and then engaged with the first film to form the junction in which case the second substrate, where it has suitable conductivity, may conveniently form the second contact.

Where the second film is a metal, it is conveniently employed as the second electrical contact. Where the second film is a metal we do not exclude the possibility that it may contain perforations, e.g. it may be in the form of a mesh.

Where the second electrical contact is in the form of a mesh, typical line widths and spacings of the lines may conveniently be determined from the equations disclosed in "Proceeding of the Institute of Radio Engineers, Volume 48, 1960 page 1246".

Anti-reflection coatings such as silicon dioxide and methods for applying them to solar cells are well known in the art.

Means for reducing or preventing the ingress of water or oxygen into solar cells are well known in the art and include inter alia glass and plastic capsules. Preferably the capsules are made of glass since these generally give cells of a longer life than those encapsulated in plastic.

Solar cells from a few millimeters square to many meters square may be prepared by the process of the invention. It is often convenient e.g. for solar cells having a surface area of more than 500 sq cm, for the second film to be in the form of discrete portions which are in electrical contact with the second contact.

A further embodiment of the invention provides a solar cell comprising a substantially pin-hole-free first film of a semiconducting sulphide, sulphoselenide, selenide or telluride, in contact with a first current conducting means, the first film forming a junction with a second film comprising a metal or a semiconductor having majority charge carriers of opposite electronic charge to the majority charge carriers in the first film, where said second film is a semiconductor it is in electrical contact with a second current conducting means and where said second film is a metal it forms a second current conducting means, at least one of the current conducting means allowing at least a portion of any radiation incident thereon to penetrate to the junction, characterised in that the first film is prepared by electrophoretically depositing the semiconductor or precursor thereof from a colloidal suspension of the semiconductor or precursor thereof in an aqueous medium.

Although we do not exclude the possibility that the junction may be a Schottky junction, preferably the junction is a p-n junction, i.e. a junction wherein both films are semiconductors, one film having majority charge carriers of opposite electronic charge to the majority charge carriers in the second film.

Particularly preferably the p-n junction is a heterojunction, i.e. the two films are of different material, although it may be a homojunction, i.e. both films comprise the same material doped with different dopants, e.g. cadmium telluride doped with iodine and cadmium telluride doped with phosphorus. Suitable dopants e.g. iodine and phosphorus and methods for incorporating them into a film, e.g. diffusion, are well known in the semiconductor art. Preferably the second film comprises a compound based on monovalent cations selected from Group IB of the Periodic Table as shown in "Advanced Inorganic Chemistry" second edition 1966 by F. A. Cotton and G. Wilkinson, published by Interscience Publishers New York, although we do not exclude the possibility that the second film may be a semiconducting element, or a compound or alloy thereof. Particularly preferably the monovalent cations are copper and more particularly preferably the second film comprises copper (I) sulphide. Precursors of the semiconductors are well known in the art as are methods for their conversion to semiconductors and for copper sulphide they include for example copper and copper (I) chloride which on heating in the presence of sulphide ions are converted into copper (I) sulphide.

It will be appreciated that where means to reduce or prevent the ingress of water and/or oxygen into the cell is employed, the said means will allow contact to be made between the current conducting means and an electrical circuit external of the cell.

It will be appreciated that the shape and disposition of the first and second current conducting means must be such that they do not form a short-circuit within the cell.

It will be appreciated that at least one of the current conducting means and, where means to reduce or prevent the ingress of water and/or oxygen into the cell is employed, the said means will allow at least a porportion of any electromagnetic radiation incident in the cell to penetrate to the junction. For examples, the material of the current conducting means may be translucent or transparent and/or the current conducting means may contain perforations, e.g. they may be in the form of a mesh. Preferably the said means for reducting or preventing the ingress of water and/or oxygen where it is employed, is transparent to electromagnetic radiation.

The invention will be further described by reference to the accompanying drawings which show, by way of example only, one embodiment of the invention. In the accompanying drawings.

Figure 1:
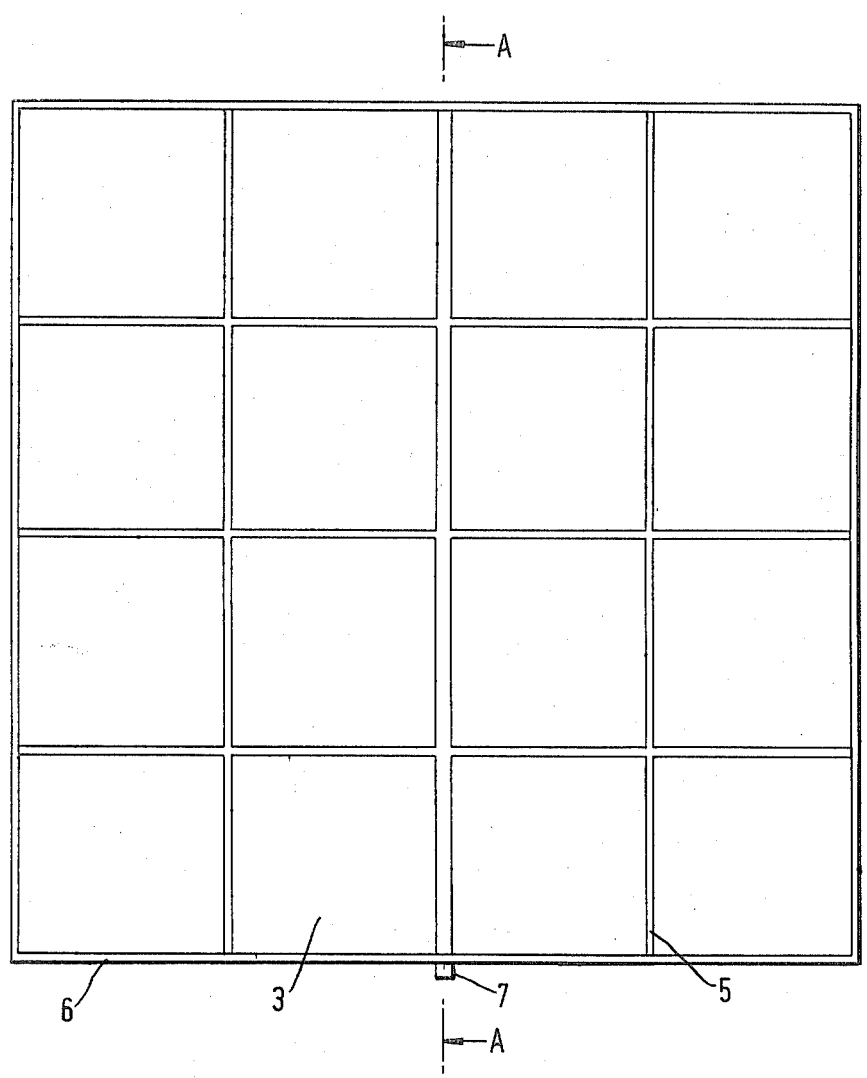
FIG. 1 is a plan view of a solar cell according to the invention
Figure 2:
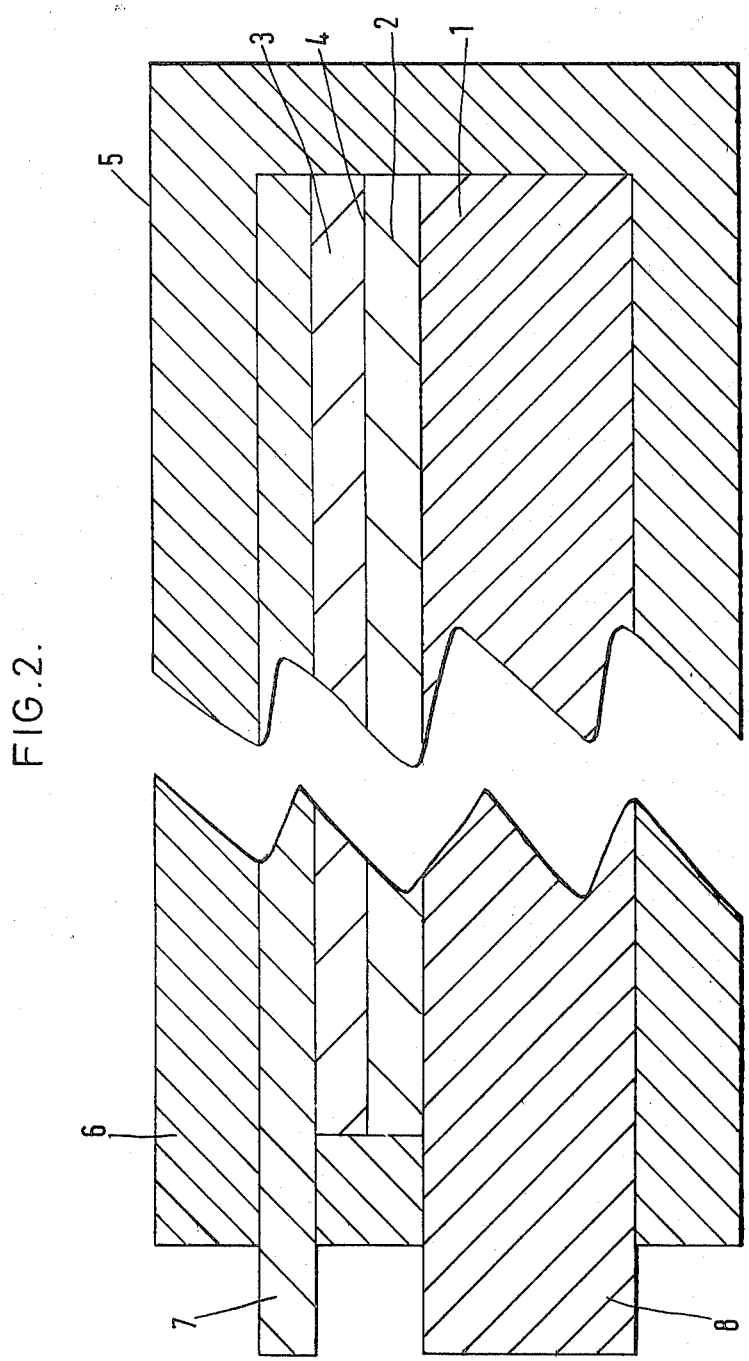
FIG. 2 is a cross-section on the line AA of FIG. 1.

In FIGS. 1 and 2 a surface of stainless steel electrical contact is in ohmic contact with a cadmium sulphide film 2, 1000 nm thick, which has been electrophoretically deposited thereon. A copper (I) sulphide film 3 forms a p-n junction 4 with the cadmium sulphide film 2. A second electrical contact in the form of a copper mesh 5 is bonded with conducting gold epoxy onto the copper (I) sulphide film 1 and a capsule 6, which may be for example of glass, encapsulates the device. Proportions 7, 8 of the electrical contacts project through the capsule to form contacts for connection to an external electrical circuit. The projections 7, 8 are sealed into the capsule with an appropriate sealant e.g. an epoxy resin. Prior to sealing the device is filled with nitrogen.

The invention is further illustrated by the following examples.

EXAMPLE 1

250 mls of 0.02 M solution of cadmium acetate in distilled water and hydrogen sulphide (at 5 ml/min) were separately added with stirring to 250 ml of water over 20 minutes. At the end of this time conversion into a colloidal suspension of cadmium sulphide was judged to be complete. Nitrogen was passed over the suspension for 1 to 3 minutes and ammonium hydroxide was then added to change the pH of the colloidal suspension from between 2.5 and 3.5 to between 3.5 and 5.0. The suspended cadmium sulphide particles were approximately 20 nm in size.

120 parts by volume of methanol were added to 30 parts by volume of the colloidal suspension. A stainless steel plate 19 sq cm in area and a stainless steel wire, 2 mm in diameter, fixed 60 mm apart were immersed to a depth of 5 cm in the suspension. The plate was an anode and the wire was a cathode. 190 volts was applied between the plate and the wire and the initial current was approximately 50 mA. The anode and the cathode were oscillated through the suspension for 3 minutes until a sufficiently thick film was obtained. The substrate and the attached film were removed from the suspension and then air dried. The cadmium sulphide film was approximately 1,000 nm thick.

The film and the substrate were heated in air at 400° C. for 45 minutes and then a 140 nm thick film of copper (I) sulphide was deposited by evaporation on the cadmium sulphide and the resulting three-layer system heated in air at 250° C. for 3 minutes. A pressure contact probe was applied to the copper (I) sulphide film and the system was employed as a solar cell wherein the substrate formed one electrical contact and the probe formed a second electrical contact. The solar cell was compared with a silicon solar cell of known efficiency using a tungsten halogen light source and a heat filter and the power efficiency was estimated at 3±0.5%

EXAMPLE 2

A substantially pin-hole-free film of cadmium sulphide was prepared according to the process of Example 1 but without the addition of ammonium hydroxide such that the pH of the colloidal suspension was 3.0

EXAMPLE 3

A substantially pin-hole-free film of cadmium sulphide was prepared according to the process of Example 1 except that the pH of the colloidal suspension was adjusted to 8.0 with ammonium hydroxide.

EXAMPLE 4

A substantially pin-hole-free film of cadmium sulphide was prepared according to the process of Example 1 except that the colloidal suspension of cadmium sulphide in water was diluted with 120 parts by volume of ethylene glycol instead of 120 parts of methanol.

EXAMPLE 5

A substantially pin-hole-free film of cadmium sulphide was prepared according to the process of Example 1 except that the colloidal suspension of cadmium sulphide in water was diluted with 120 parts by volume of N,N-dimethylformamide instead of 120 parts of methanol.

EXAMPLE 6

A substantially pin-hole-free film of cadmium sulphide was prepared according to the process of Example 1 except that the colloidal suspension of cadmium sulphide in water was diluted with 120 parts by volume of acetonitrile instead of 120 parts of methanol.

EXAMPLE 7

A substantially pin-hole-free film of cadmium sulphide was prepared according to the process of Example 1 except that 0.1 gm of L-ascorbic acid were added to the colloidal suspension of cadmium sulphide in aqueous methanol prior to electrophoresis.

EXAMPLE 8

A substantially pin-hole-free film of cadmium sulphide was prepared according to the process of Example 1 except that 2 ml of an aqueous solution of guar gum was added to the colloidal suspension of cadmium sulphide in aqueous methanol prior to electrophoresis.

EXAMPLE 9

A substantially pin-hole-free film of cadmium sulphide was prepared according to the process of Example 1 except that 2 ml of a sodium stearate solution (1 gm of sodium stearate in 500 ml of water) were added to the colloidal suspension of cadmium sulphide in aqueous methanol prior to electrophoresis.

EXAMPLE 10

A substantially pin-hole-free film of cadmium sulphide doped with bromine was prepared according to the process of Example 1 except that 1 ml of bromine water was added to the colloidal suspension of cadmium sulphide in water to give a concentration of $6 \times 10^{-6}$ gm of the bromine in the colloidal suspension.

EXAMPLE 11

A substantially pin-hole-free film of cadmium sulphide was prepared according to the process of Example 1 except that the working electrode was a graphite plate.

EXAMPLE 12

The process of Example 1 was repeated except that the working electrode was a conducting layer A on a carrier B where A and B were as designated in Table 1. Substantially pin-hole-free films of cadmium sulphide were obtained.

TABLE 1
Conducting surfaces for the deposition of Cadmium Sulphide

| A<br>Conducting layer | B<br>Carrier |
| --- | --- |
| Platinum (solution coated) | Glass |
| Gold (screen printed) | Alumina |
| Gold (ion plated) | Polyethersulphone |
| Gold (ion plated) | Polyethyleneterephthalate |
| Gold (ion plated) | Polyimide |
| Stainless steel (ion plated) | Polyethersulphone |
| Stainless steel (ion plated) | Polyethyleneterephthalate |
| Stainless steel (ion plated) | Polyimide |
| Stainless steel (sputtered) | Alumina |
| Stainless steel (ion plated) | Glass |
| Stainless steel (ion plated) | Stainless steel |
| Stainless steel/copper (ion plated) | Glass |
| Tin Oxide | Glass |

EXAMPLE 13

The process of Example 1 was repeated except that the electrodes were two parallel sheets of stainless steel 20 cm² spaced 3 cm apart.

EXAMPLE 14

The process of Example 1 was repeated except that the electrodes were two parallel sheets of stainless steel 630 cm², spaced 1 cm apart, between which a voltage of 50 v was applied to give an initial current of 650 mA.

EXAMPLE 15

The process of Example 1 was repeated except that the deposited films of cadmium sulphide were separately subjected to the heat treatment shown in Table 2.

TABLE 2
Heat Treatment of Cadmium Sulphide Films

| Atmosphere | Temperature (°C.) |
| --- | --- |
| Nitrogen | 200 |
| Nitrogen | 400 |
| Nitrogen | 500 |
| Forming Gas | 400 |
| Forming Gas | 550 |
| Vacuum | 550 |
| Vacuum | 400 |
| Argon | 200 |

EXAMPLE 16

250 ml of 0.02 M solution of zinc acetate in distilled water and hydrogen sulphide (at 5 ml/min) were separately added with stirring to 250 ml of water over 20 minutes to give a colloidal suspension of zinc sulphide in water. Nitrogen was passed over the suspension for 1 to 3 minutes and ammonium hydroxide was added to charge the pH of the colloidal suspension from between 2.5 and 3.5 to between 3.5 and 5.0. 120 parts by volume of methanol were added to 30 parts by volume of the colloidal suspension of zinc sulphide in water. Two stainless steel plates 20 cm² were held parallel 1 cm apart in the colloidal suspension and a voltage of 60 volts was applied between them. A substantially pin-hole-free film of zinc sulphide was deposited on the surface of the anode.

EXAMPLE 17

A solar cell was prepared according to the process of Example 1 except that the surface of the cadmium sulphide film was etched with argon ions prior to the deposition of the copper (I) sulphide film thereon in a vacuum.

EXAMPLE 18

A solar cell was prepared according to the process of Example 1 except that the copper (I) sulphide film was applied by a copper ion dip technique and was then heated in air for 2 minutes at 200° C.

EXAMPLE 19

A solar cell was prepared according to the process of Example 1 except that the copper (I) sulphide film was pepared by evaporating a layer of copper (I) chloride, 200 nm thick, onto the cadmium sulphide film and heating it in air for 4 minutes at 170° C.

EXAMPLE 20

A solar cell was prepared according to the process of Example 1 except that the copper (I) sulphide film was prepared by evaporating a layer of copper, 100 nm thick, onto the cadmium sulphide film and heating it in air for 1 minutes at 250° C.

EXAMPLE 21

A solar cell was prepared according to the process of Example 1 except that the second electrical contact was applied by evaporating a gold strip onto the copper (I) sulphide film.

EXAMPLE 22

A solar cell was prepared according to the process of Example 1 except that the second electrical contact was a screen-printed silver mesh.

EXAMPLE 23

A solar cell was prepared according to the process of Example 1 except that the second electrical contact was a gold-plated copper mesh bonded to the copper (I) sulphide film with a gold filled epoxy resin.

EXAMPLE 24

A solar cell was prepared according to the process of Example 1 except that the second electrical contact was a preformed copper mesh or gold-plated copper mesh and the films and the electrical contacts were encapsulated in a plastic material which was sealed under vacuum.

EXAMPLE 25

A solar cell was prepared according to the process of Example 1 except that the combination of the film and the electrical contacts were encapsulated by casting in an epoxy resin.

EXAMPLE 26

A solar cell was prepared according to the process of Example 1 except that the combination of the film and the electrical contacts were encapsulated in a capsule made of slumped glass cover sealed under vacuum, and let up under nitrogen.

EXAMPLE 27

A solar cell was prepared according to the process of Example 1 except that a Schottky barrier was generated by evaporating gold onto the cadmium sulphide film. The open circuit voltage of the solar cell was 350 mV and the power efficiency was $6\times 10^{-1}\%$.

EXAMPLE 28

A solar cell was prepared according to the process of Example 1 except that the cadmium sulphide was deposited on a working electrode (A) supported on a carrier (B) and then heated in air for 45 minutes at (C)°C. as shown in Table 3.

TABLE 3

| Preparation of Solar Cells | | |
|---|---|---|
| A Working Electrode | B Carrier | C Heat Treatment °C. |
| Platinum (solution coated) | Glass | 450 |
| Gold (screen printed) | Alumina | 450 |
| Gold (ion plated) | Polyethersulphone | 200 |
| Gold (ion plated) | Polyethyleneterephthalate | 150 |
| Gold (ion plated) | Polyimide | 450 |
| Stainless steel (sputtered) | Alumina | 450 |
| Tin Oxide | Glass | 450 |

What we claim is:

1. A method for the preparation of a substantially pin-hole-free film of thickness less than 5000 nm of a semiconducting sulphide, sulphoselenide, selenide or telluride which method comprises
   (a) preparation of the semiconductor by a metathetical reaction in water or in a mixture of water and at least one water-miscible polar organic liquid, the semiconductor being prepared in the form of a colloidal suspension of colloidal particles having an average diameter between 1 and 100 nm,
   (b) where the preparation is effected in water, addition of at least one water-miscible polar organic liquid to the colloidal suspension,
   (c) electrophoresis of the colloidal suspension to deposit the colloidal particles on a surface of a substrate, said substrate being supported on a carrier which is flexible.

2. A method for the preparation of a film according to claim 1 wherein the colloidal particles have an average diameter between 5 nm and 35 nm.

3. A method for the preparation of a film according to claim 1 wherein the colloidal particles are negatively charged.

4. A method for the preparation of a film according to claim 1 wherein the organic liquid has a dielectric constant greater than 10.

5. A method for the preparation of a film according to claim 1 wherein a starting material for the preparation of the semiconductor is gaseous.

6. A method for the preparation of a film according to claim 1 wherein the pH of the colloidal suspension is between 3.0 and 8.0.

7. A method for the preparation of a film according to claim 1 wherein the colloidal suspension contains a stabiliser.

8. A method for the preparation of a film according to claim 1 wherein the colloidal suspension contains a dopant.

9. A method for the preparation of a film according to claim 1 wherein the colloidal suspension contains a binding agent.

10. A method for the preparation of a film according to claim 1 wherein the said substrate is a working electrode in an electrical circuit.

11. A method for the preparation of a film according to claim 10 wherein the said working electrode is an anode.

12. A method for the preparation of a film according to claim 11 wherein the working electrode is planar and a counter electrode in the form of a wire is present.

13. A method for the preparation of a film according to claim 1 wherein the semiconductor after deposition on the said surface is heat treated.

14. A method for the preparation of a film according to claim 13 wherein heating is effected by gaseous ion bombardment.

15. A thin substantially pin-hole-free film of a semiconducting sulphide, sulphoselenide, selenide or telluride prepared according to claim 1.

16. A thin substantially pin-hole-free film as claimed in claim 15 containing a dopant.

17. A laminate comprising a thin substantially pin-hole-free film as claimed in claim 15 and a substrate, on a surface of which the said film has been electrophoretically deposited.

18. An electronic device comprising a film as claimed in claim 15 and at least one means for conducting current in electrical contact therewith.

19. A method for the preparation of a solar cell comprising the steps of preparing a thin substantially pin-hole-free first film of a semiconducting sulphide, sulphoselenide, selenide or telluride, and forming a metal/-semiconductor or a p/n junction between the first film and a second film comprising a metal or a semiconductor having majority charge carriers of opposite electronic charge to the majority charge carriers in the first film, the first film being in electrical contact with a first current conducting means and the second film, where it is a semiconductor, being in electrical contact with a second current conducting means at least one of the current conducting means allowing radiation incident thereon to penetrate to the junction, characterized in that the first film is prepared by a process as claimed in claim 1.

20. A method for the preparation of a solar cell as claimed in claim 19 wherein the first film is electrophoretically deposited on the first current conducting means.

21. A method for the preparation of a solar cell as claimed in claim 19 wherein the junction is a p-n junction.

22. A method for the preparation of a solar cell as claimed in claim 21 wherein the junction is a heterojunction.

23. A method for the preparation of a solar cell as claimed in claim 22 wherein the second film comprises a compound based on monovalent cations selected from Group IB of the Periodic Table.

24. A method for the preparation of a solar cell as claimed in claim 23 wherein the monovalent cation is copper.

25. A method for the preparation of a solar cell as claimed in claim 24 wherein the second film comprises copper (I) sulphide.

26. A method for the preparation of a solar cell as claimed in claim 19 comprising the step of heating the junction to improve electrical contact between the films.

27. A method for the preparation of a solar cell as claimed in claim 19 comprising the step of providing an antireflection coating to reduce or prevent the reflection of incident radiation from the surface of the film which is to be subjected to incident radiation.

28. A method for the preparation of a solar cell as claimed in claim 19 comprising the step of providing means to prevent or reduce the ingress of oxygen and/or water into the cell, said means allowing electrical contact to be made between the said current conducting means and an electrical circuit external to the cell.

29. A solar cell prepared according to a method as claimed in claim 19.

30. A method as in claim 1 wherein the flexible carrier is a film of a thermoplastic material.

31. A method as in claim 30 wherein the thermoplastic material is selected from the group consisting of polyethylene terephthalate, polyethersulphone and polyimide.

32. A method as in claim 1 wherein the substrate is in the form of a strip which is progressively transported through the said colloidal suspension to effect continuous deposition.

* * * * *